Figure 1:
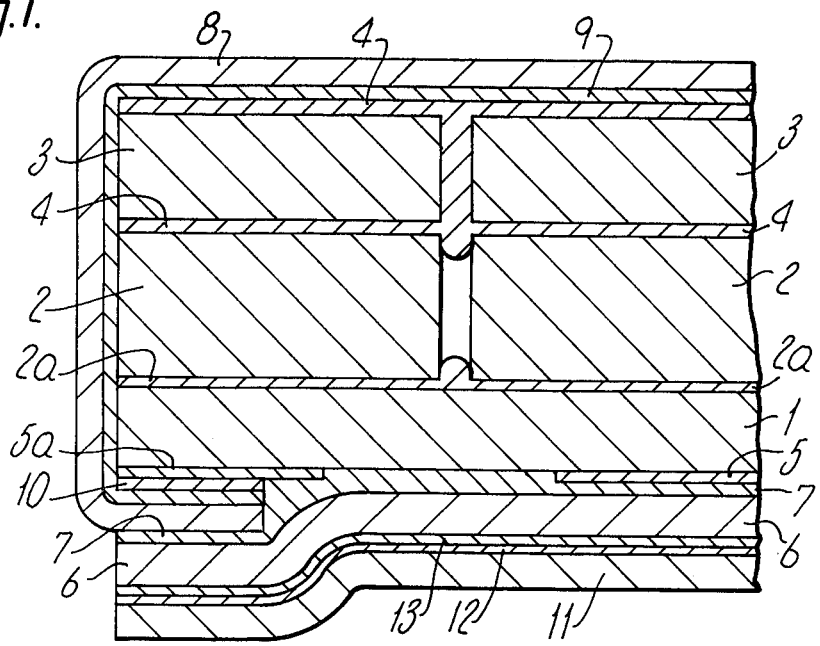

United States Patent [19]
Fellas

[11] 4,433,201
[45] Feb. 21, 1984

[54] SOLAR POWER ARRAYS FOR SPACECRAFT

[75] Inventor: Christakis N. Fellas, Hatfield, England

[73] Assignee: British Aerospace Public Limited Company, London, England

[21] Appl. No.: 374,022

[22] Filed: May 3, 1982

[30] Foreign Application Priority Data

May 2, 1981 [GB] United Kingdom ............... 8113615

[51] Int. Cl.$^3$ ............................................ H01L 31/04
[52] U.S. Cl. .................................. 136/251; 136/245; 136/292; 244/173
[58] Field of Search ..................... 136/245, 251, 292; 244/173

[56] References Cited

U.S. PATENT DOCUMENTS 4,043,834  8/1977  Rüsch ............................. 136/245
4,232,070  11/1980  Inouye et al. .................... 428/49

OTHER PUBLICATIONS

H. S. Rauschenbach, "Solar Cell Array Design Handbook", Van Nostrand Reinhold Company, (1980), pp. 145–146.

Primary Examiner—Aaron Weisstuch
Attorney, Agent, or Firm—Cushman, Darby & Cushman

[57] ABSTRACT

A laminar plastics material sheet including a transparent, electrically conductive layer used to cover the front and/or rear surfaces of a spacecraft solar array to alleviate electrostatic charge build-up thereon due to electron bombardment.

6 Claims, 3 Drawing Figures

U.S. Patent  Feb. 21, 1984  4,433,201

SOLAR POWER ARRAYS FOR SPACECRAFT

This invention relates to solar power generating arrays for spacecraft such as communications satellites. Objects in space are continually bombarded by high energy electrons. As a result, any dielectric surfaces of a spacecraft may become charged up to a high potential relative to the conductive parts of the craft. Eventually, there may occur discharges between the dielectric surfaces and conductive parts, this possibly causing damage and/or disturbing electronic equipment on-board the craft.

One particular area where the above problem may arise is in relation to a thermal blanket used for control of the heat loss/gain characteristics of a spacecraft. Our United Kingdom patent application No. 2,062,189A discloses a thermal control material which may be used for a spacecraft thermal blanket and in connection with which the electron bombardment charging problem has been considered.

The solar power generating array(s) of a spacecraft may also be subject to electron bombardment charging. Such an array comprises a large number of solar cells which are normally protected by glass or quartz coverslips. While the cells, and hence the coverslips, are illuminated by the sun, a consequent photo-electric effect prevents charge build-up on the cover slip surfaces. During eclipses, however, the photoelectric effect disappears while the electron bombardment continues. To alleviate charge build-up problems during eclipse, it has been proposed to make the coverslips of electrically conductive glass or to apply to the outer surfaces thereof a transparent conductive coating. Neither of these proposals work very well however.

The rear or dark side of the solar array is intended always to face deep space and it is desirable that this surface should act, overall, as a heat radiator to lower the array temperature and thereby maximise the solar cell efficiency. Accordingly, the back surface of the array is usually painted with black electrically conductive paint.

Such paint is quite heavy and easily subject to damage, for example by being overheated during not uncommon incidences of the back side of the array being temporarily exposed to the sun rather than facing away from it.

It is an object of this invention to provide for the sun-facing surface of a solar array a protective cover sheet upon which the build-up of electrical charge to dangerously high potentials is inhibited. A further object is to provide a cover for the rear surface of the array, which cover is able to conduct away electron bombardment induced surface charges provided it is appropriately designed, but which may be more satisfactory than a black conductive paint layer at least from the point of view of its thermo-optical properties and its susceptibility to damage and possibly also as regards its mass.

According to the invention, there is provided a solar power generating array for a spacecraft having a protective cover sheet over a surface portion of the array, the cover comprising an outer layer of flexible transparent plastics material and a layer, nearer the said array surface portion than said outer layer, of transparent, electrically conductive material.

The invention is based partly upon the realisation that the electrons bombarding a spacecraft in space have such energy that they penetrate the surface of any dielectric materials exposed thereto and hence result in charge build-up not only at the exposed surface but also to a varying depth within the dielectric material. A conductive layer at the outer surface of the dielectric material will also be penetrated by at least some of the electrons and hence may not be able to inhibit charge build-up within the material. Accordingly, in the embodiments of the invention to be described, a protective cover sheet for a solar array is arranged so that a conductive layer of the sheet is positioned at the inner surface of an outer plastics material layer either adjacent to the solar array or cover slips forming part of the array, or between the outer plastics layer and one or more further plastics material layers.

Figures 2, 3:
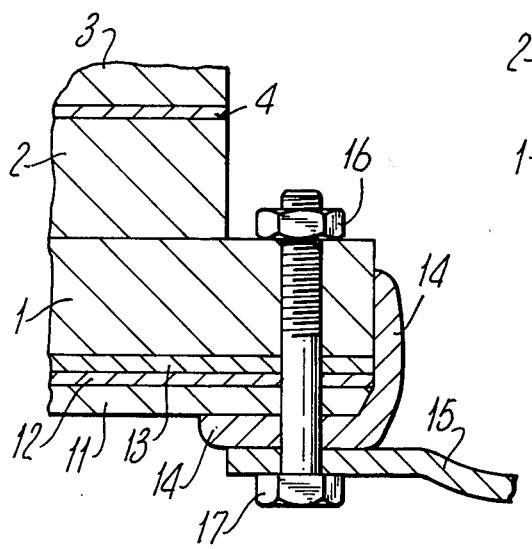

For a better understanding of the invention and to show how the same may be carried into effect, reference will now be made, by way of example, to the accompanying drawing, in which:

FIG. 1 is a sectional side-view of part of a solar array for a spacecraft, the figure being drawn not to scale but rather with the thicknesses of certain layers of material exaggerated to clarify the presence thereof, and FIGS. 2 and 3 are similar views of a part of the substrate of a further array showing respective different ways of grounding a conductively coated plastics sheet.

The solar array of FIG. 1 comprises a thin flexible substrate 1 made of Kapton about 0.003" thick. A plurality of solar cells 2 are attached to one surface of the substrate by any suitable means (not shown) for example, by adhesive 2a or by having electrical contact portions of the cells soldered to metallic conductor portions provided on the substrate. A glass or quartz cover slip 3 is fixed to the front surface of each cell 2 by means of a transparent adhesive 4 of a kind which, as well as fixing the slips 3 in place, also form an optical matching layer between the cells and slips to maximize the transmission of solar energy to the cell. The adhesive could be Dow Corning silicone cement No. 93500, for example. On the rear surface of the substrate 1 there is provided a printed circuit track arrangement 5 including a ground line track 5a. Interconnections between the cells 2 or groups of cells and circuit arrangement 5 is made by any suitable means (not shown), for example by taking conductor wires (not shown) through apertures in the substrate.

A sheet 6 of Kapton about 0.002" thick is fixed by a layer of polyester adhesive 7 to the rear surface of the substrate 1 over the printed circuit arrangement 5.

To prevent charge build-up on the front surface of the solar array, i.e. on the cover slips 3, a thin sheet of Kapton 8 about 0.0003" thick with a pre-deposited coating of transparent, electrically conductive material 9 such as Indium-tin-oxide on its inner surface is laid over the cover slips and fixed thereto by the aforementioned silicone adhesive which is also able to act as an optical matching layer between the slips 3 and sheet 8. The edge of the sheet 8 is wrapped around the edge of the array and secured to the ground line track 5a beneath the edge of sheet 6 by electrically conductive adhesive 10. This adhesive provides an electrical connection between coating 9 and track 5a and hence provides a path to ground for electrical charge collected by the coating.

The sheet 8 with its coating 9 could be applied to the array as a single piece or as several pieces or strips applied to respective different parts of the array.

Instead of being coated with black conductive paint as in the prior art, the rear surface of the array, i.e. the outer surface of sheet 6, is covered by a further thin sheet 11 of Kapton about 0.0003" thick with a pre-deposited coating 12 of Indium-tin-oxide, the coating 12 facing inwardly towards sheet 6 and being fixed thereto by a layer of clear polyester adhesive 13.

The combination of the two Kapton sheets 6 and 11, and the intermediate Indium-tin-oxide coating 12 and clear adhesive layer 13 may be pre-manufactured as a composite sheet, the composite sheet then being applied to the solar array as required during manufacture thereof. Such a composite sheet might have an absorptivity factor of around 0.46 and a radiation emissivity of about 0.83. For a typical black conductive paint used in the art, the corresponding figures might be about 0.96 absorptivity factor and 0.86 emissivity. Meanwhile, the mass of the sheet 11 may be less than that of a coating of paint and may have greater ability to withstand high temperature without damage.

The coating 12 on sheet 11 is, like the coating 9 on sheet 8, connected to ground so that electrical charge is prevented from building up to too high a potential. The grounding can be done by bonding the coating to an exposed portion of the ground track 5a, i.e. as shown for coating 9 in FIG. 1, or by any other suitable means, for example either of the ways shown in FIGS. 2 and 3. Each of these figures illustrates a modified array wherein, since the rear face of the substrate 1 does not carry any printed circuit tracks (instead all the interconnections are made at the solar cell side of the array), the protective sheet 6 of FIG. 1 is not needed and is hence not used. Thus, the coated sheet 11 is now fixed by clear adhesive layer 13 direct to substrate 1. In FIG. 2, the edge of the substrate and the edge of the sheet 11 have conductive paint 14 applied thereto, the paint making contact with the coating 12 on sheet 11 and with a grounding strap 15, which is fixed to the substrate by a nut and bolt 16, 17 and to a grounded or metallic part of the spacecraft or array mounting structure (not shown). In FIG. 3, the edge of the sheet 11 is turned over to expose a portion of coating 12 and a grounding strap is connected to the substrate, so as to make contact with the exposed coating portion, again by a nut and bolt 16, 17.

As will be appreciated, either of the grounding methods shown in FIGS. 2 and 3, or any other suitable grounding means, could be used also or alternatively for the coating 9 of the front surface sheet 8 in FIG. 1.

Instead of comprising a sheet with a pre-deposited Indium-tin-oxide coating and being adhesively bonded in position, the front and/or back array faces can be covered by uncoated sheets fixed in place by electrically-conductive clear adhesive, e.g. a clear adhesive with an electrically conductive filler.

Instead of Kapton, another suitable space-approved sheet plastics material could be used, for example "Tedlar" which, like Kapton, is available from the DuPont Company.

In further embodiments (not shown), the cover slips 3 are not used and instead the sheet 6 with its conductive coating is applied direct to the solar cells (possibly, it may be advantageous to then make the sheet 6 somewhat thicker than was suggested earlier) or a multiple layer sheet like that applied to the dark side of the substrate in FIG. 1, i.e. with inner and outer Kapton layers and an intermediate conductive layer, is applied direct to the solar cell surfaces. Naturally, for these further embodiments, appropriate alternative assembly procedures for building the array may need to be developed.

In yet a further embodiment (not shown), the array is as shown in FIG. 1 but, between the cover slips 3 and the conductive coating of sheet 6, there are interposed one or more layers of optically transparent plastics and/or conductive material in order to improve adhesion of the overall combination to the array and/or to control the thermo-optical properties as desired, due account being taken of course of the need not to degrade the solar cell efficiency too greatly.

As mentioned earlier, Kapton and information about it is available from the DuPont Company, the full name and one of the Companies' addresses being E.I. du Pont de Nemours and Company (Inc), Wilmington, Del. 19898. Kapton refers to that Company's fluorinated ethylenepropylene (FEP) copolymer coated polyamide film. Also as mentioned earlier, suitable plastics sheet material other than Kapton may be used in this invention.

I claim:

1. A solar cell power generating array for a spacecraft having a protective cover sheet over a surface portion of the array, the cover comprising an outer layer of flexible transparent plastics material and a layer, nearer the said array surface portion than said outer layer, of transparent, electrically conductive material.

2. An array according to claim 1, wherein said conductive inner layer is adapted to be grounded to the spacecraft structure by the sheet being wrapped around an edge of the array and fixed to the rear surface thereof by conductive adhesive.

3. An array according to claim 1, wherein said cover sheet is provided by taking a sheet of flexible transparent material having a pre-deposited coating of said transparent conductive material thereon and adhesively fixing the sheet to the sun-facing surface of the array with the conductive coating nearer the array.

4. An array according to claim 1 wherein said cover sheet is attached by a layer of clear adhesive to the rear surface of the array.

5. An array according to claim 3 or 4 wherein the cover sheet comprises, between the conductive layer and the array, at least one further transparent plastics material layer.

6. An array according to claim 1, comprising a plurality of solar cells mounted on one surface of a substrate made of flexible plastics material and, a cover sheet comprising an inner layer of transparent electrically conductive material and an outer layer of flexible transparent plastics material fixed by a layer of clear adhesive to the opposite surface of the substrate.

* * * * *